(12) United States Patent
Lin

(10) Patent No.: US 7,559,669 B2
(45) Date of Patent: Jul. 14, 2009

(54) COIN SHAPED LIGHT-EMITTING DEVICE AND COIN SHAPED SPOTLIGHT COMPRISING SAME

(76) Inventor: Yuan Lin, 5 Viewmont Court, Doncaster East, 3109 Vic (AU)

( * ) Notice: Subject to any disclaimer, the term of this patent is extended or adjusted under 35 U.S.C. 154(b) by 175 days.

(21) Appl. No.: 11/649,895

(22) Filed: Jan. 5, 2007

(65) Prior Publication Data

US 2008/0048566 A1 Feb. 28, 2008

(30) Foreign Application Priority Data

Aug. 25, 2006 (TW) ............... 95131440 A

(51) Int. Cl.
*F21L 4/04* (2006.01)
(52) U.S. Cl. .................. 362/202; 362/208; 362/800
(58) Field of Classification Search ............ 315/200 A, 315/210, 224, 291; 262/202, 208, 227, 800, 262/804

See application file for complete search history.

(56) References Cited

U.S. PATENT DOCUMENTS

2003/0189829 A1* 10/2003 Shimizu et al. ............. 362/240
2004/0105264 A1* 6/2004 Spero ......................... 362/276
2005/0237747 A1* 10/2005 Shimizu et al. ............. 362/294
2006/0207784 A1* 9/2006 Chang ........................ 174/88 C
2006/0221594 A1* 10/2006 Thuot Rann et al. .......... 362/96
2007/0273290 A1* 11/2007 Ashdown et al. ............ 315/113

* cited by examiner

*Primary Examiner*—David Hung Vu
*Assistant Examiner*—Tung X Le
(74) *Attorney, Agent, or Firm*—Guice Patents PLLC

(57) ABSTRACT

A coin shaped light-emitting device is disclosed and includes a light-emitting member formed by encapsulating and wiring a plurality of LEDs on a thin substrate, a constant current controller for operating the light-emitting member in constant current and causing the light-emitting member to emit bright light, and a shell for enclosing the light. A water-resistant arrangement is further incorporated into the light-emitting device. A coin shaped spotlight is further disclosed and is formed by connecting a plurality of light-emitting devices in series, in parallel, or in another configuration. The spotlight has advantages of increased reliability, energy saving, and prolonged useful life.

13 Claims, 5 Drawing Sheets

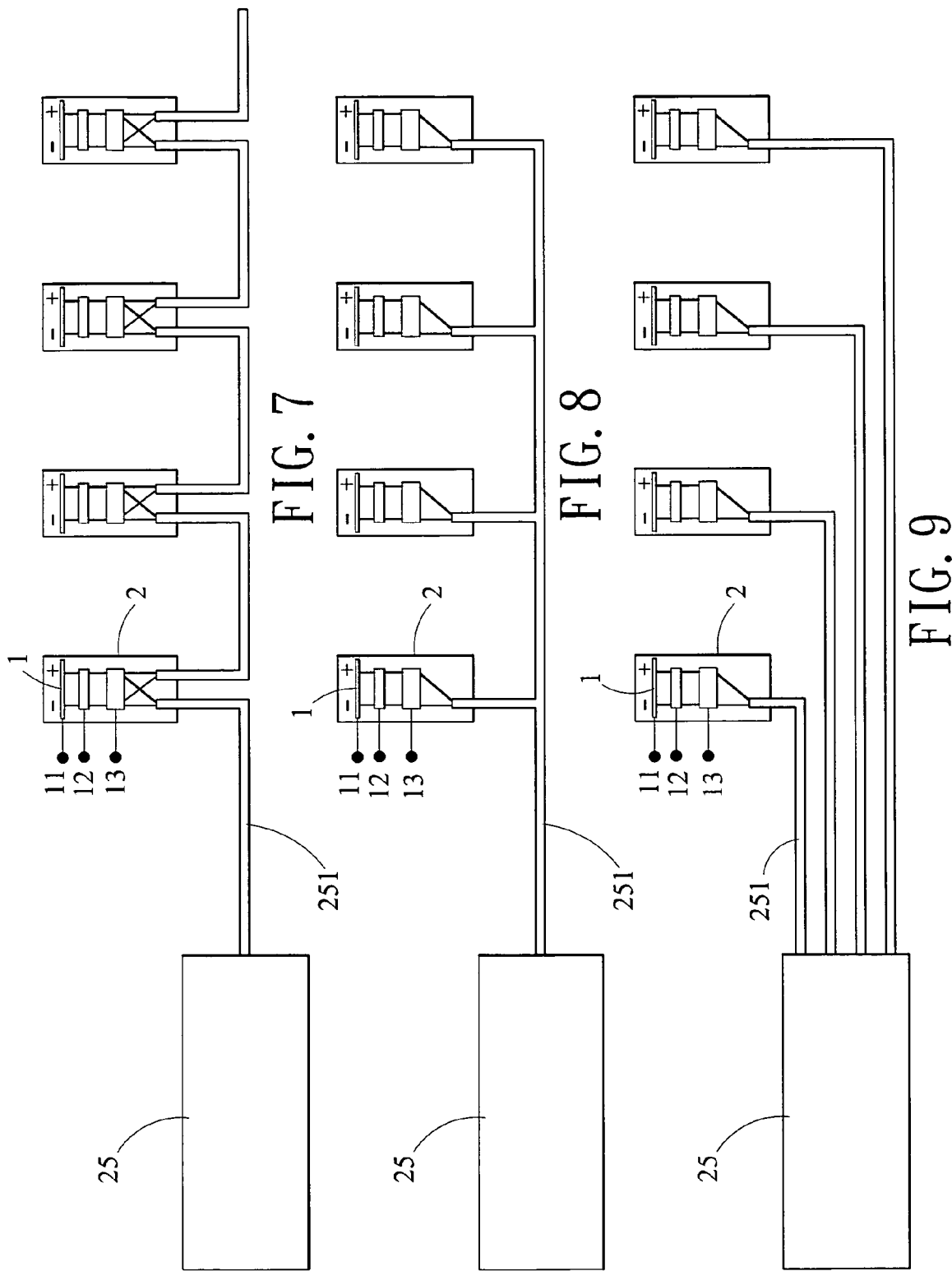

US 7,559,669 B2

COIN SHAPED LIGHT-EMITTING DEVICE AND COIN SHAPED SPOTLIGHT COMPRISING SAME

BACKGROUND OF THE INVENTION

1. Field of Invention

The invention relates to LED (light-emitting diode) lights and more particularly to a coin shaped light-emitting device including LEDs and a coin shaped spotlight comprising a plurality of light-emitting devices with improved characteristics including increased reliability, energy saving, and prolonged useful life.

2. Description of Related Art

Conventionally, a spotlight employs a halogen bulb which has the disadvantages of consuming energy and generating high temperature in use. Recently, LED lights are gaining popularity due to its advantageous features including low energy consumption and sufficient brightness. Thus, halogen lamps are gradually replaced by LED lights. There is a type of LED light as a spotlight commercially available. The LED bulb has the shape of a halogen bulb. As such, the LED light including the LED bulb is relatively large. Further, rails for mounting LED lights are required. Furthermore, the LED bulb has a narrow operating voltage. That is, voltage is required to be highly stable. Hence, the LED light cannot operate normally if an external source of power is not stable (i.e., large voltage variations). This has the disadvantages of shortening its useful life, etc.

Taiwanese Utility Model Patent No. M269,398 discloses a LED light comprising an array of a plurality of LEDs formed on a circuit board, a power supply circuit formed on a shell of the light, fin-shaped heat sinks, and a fan together for removing heat generated by the operating light.

While the Taiwanese Patent can emit highly bright light rays, it has disadvantages the same as that described in the above first paragraph. Thus, continuing improvements in the exploitation of LED light are constantly being sought.

SUMMARY OF THE INVENTION

It is therefore one object of the invention to provide a coin shaped light-emitting device comprising a coin shaped light-emitting member formed by encapsulating a plurality of LEDs, a constant current controller for operating the light-emitting member in constant current and causing the light-emitting member to emit bright light, and a shell for enclosing the light; and a coin shaped spotlight comprising a plurality of light-emitting devices. By utilizing the invention, a thin, stable spotlight is obtained. Further, the spotlight has the advantages including increased reliability, energy saving, and prolonged useful life.

In one aspect of the invention, there is provided a coin shaped spotlight including a plurality of light-emitting devices each comprising a coin shaped light comprising a light-emitting member comprising a plurality of LEDs and a lens formed together by encapsulation; a constant current controller electrically connected to the light-emitting member for supplying a constant current; and an electrical connector electrically connected the constant current controller and the light-emitting member to a source of power; and a shell comprising a hollow cylindrical case; a cover releasably secured to one end of the case and comprising a central through hole; a hollow cylinder mounted within the case for fastening the light-emitting member, the constant current controller, and the connector together; and a fastener comprising a hollow first portion threadedly secured to the other end of the case, a hollow internal water-resistant member with wires passed through the water-resistant member and the case, and a hollow second portion threadedly secured to the other end of the first portion for fastening the water-resistant member in the first portion.

In another aspect of the invention the constant current controller comprises parallel first and second constant current control circuits, each of the first and second constant current control circuits comprising an operational amplifier; a reference voltage source electrically connected to a first resistor which is in turn electrically connected to a negative terminal of the source of power so as to apply a reference voltage to a negative terminal of the operational amplifier via the first resistor and the reference voltage source; a sampling resistor interconnected a positive terminal of the source of power and a positive terminal of the operational amplifier so as to apply a sampling voltage to the positive terminal of the operational amplifier via the sampling resistor; and a switch adapted to conduct or cut off an output of either the first constant current control circuit or the second constant current control circuit based on a comparison result of the reference voltage and the sampling voltage.

The above and other objects, features and advantages of the invention will become apparent from the following detailed description taken with the accompanying drawings.

BRIEF DESCRIPTION OF THE DRAWINGS

FIGS. 7, 8, and 9 schematically depict connections of first, second, and third preferred embodiments of coin shaped spotlight comprising a plurality of coin shaped light-emitting devices according to the invention.

DETAILED DESCRIPTION OF THE INVENTION

Figure 1:
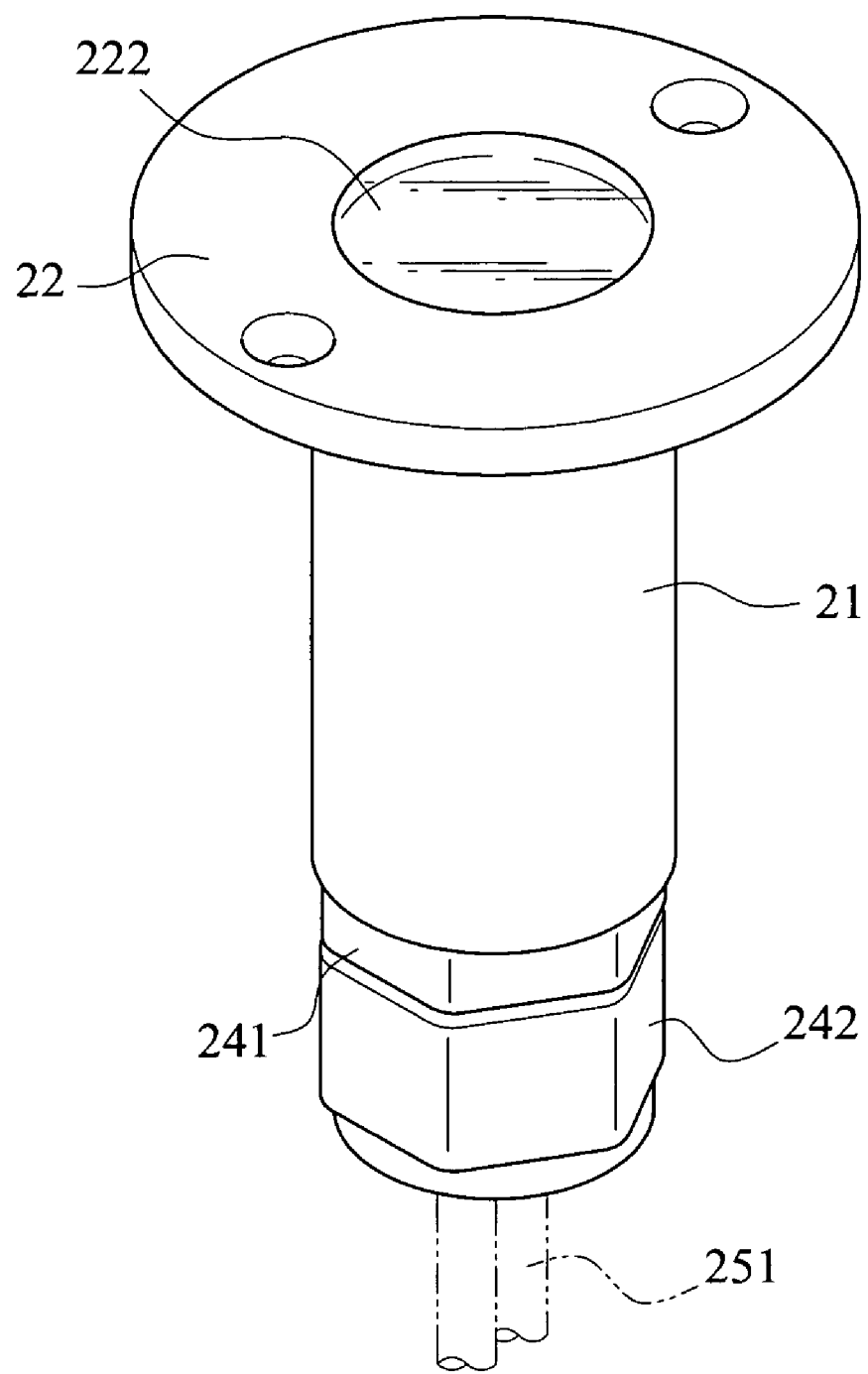
FIG. 1 is a perspective view of a coin shaped light-emitting device according to the invention.
Figure 2:
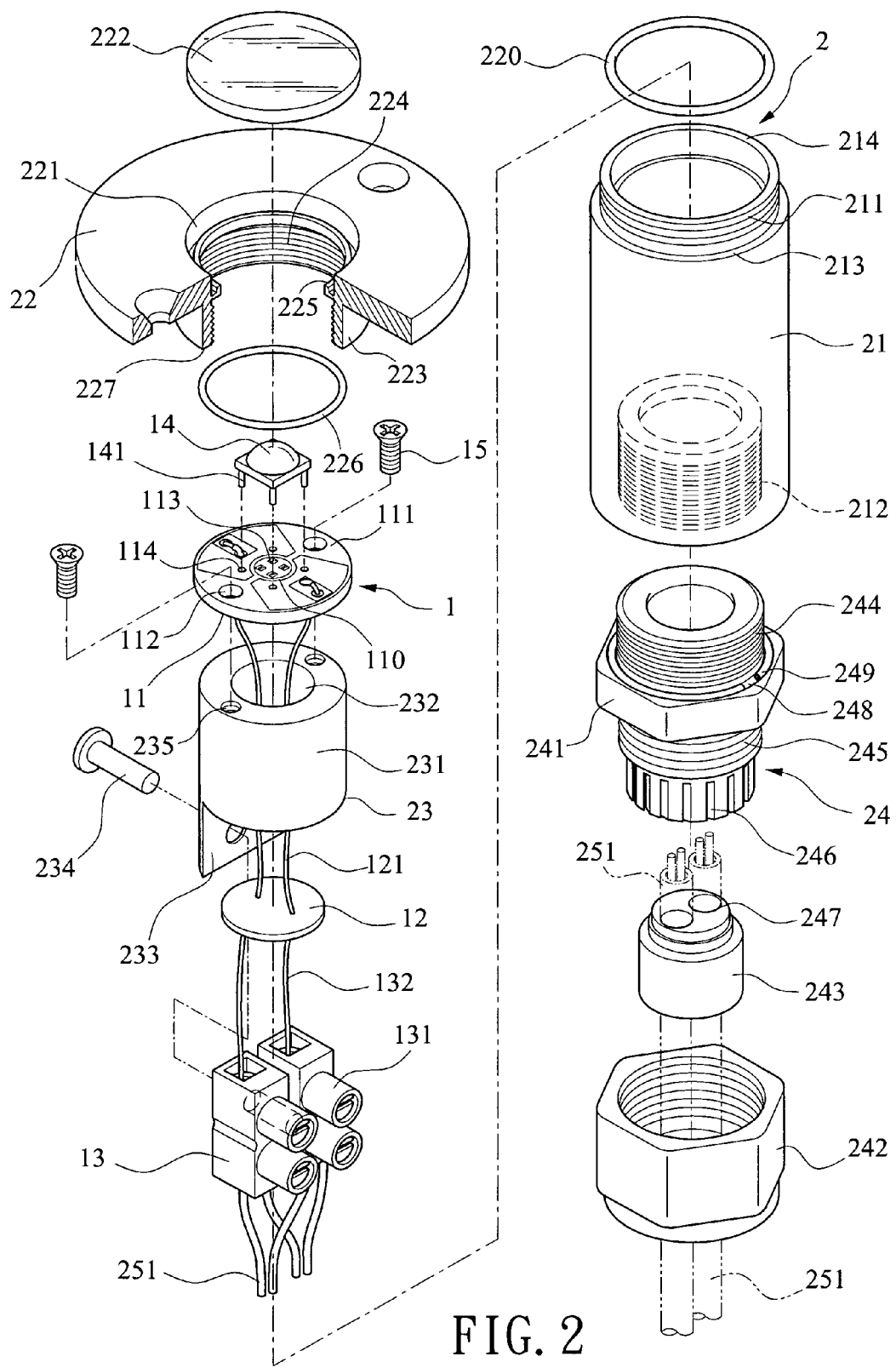
FIG. 2 is an exploded perspective view of a coin shaped light-emitting device according to the invention.

Referring to FIG. 2, a coin shaped light-emitting device in accordance with the invention comprises a coin shaped light 1 and a shell 2 for enclosing the light 1. The light-emitting device is adapted to operate in constant current and emit bright light. Thus, a spotlight including a plurality of series connected, parallel connected, or otherwise connected light-emitting devices the diameter thereof can be made as small as a coin.

The light 1 comprises a light-emitting member 11, a constant current controller 12, and an electrical connector 13. Each component is discussed in detailed below.

The light-emitting member 11 comprises a disk shaped substrate 111 and a high power LED array 110. A square lens 14 having four corner legs 141 mounted in four apertures 114 of the substrate 111. Four LEDs 113 of the LED array 110 are mounted on a center of a top surface of the substrate 111 by encapsulation. Two opposite through holes 112 are formed on the substrate 111. Two fasteners (e.g., screws) 15 are driven through the holes 112 into threaded holes 235 of a cylinder 23 for securing the substrate 111 to the cylinder 23.

The constant current controller 12 is electrically connected to both the light-emitting member 11 and the LED array 110.

As such, the LED array 110 is adapted to operate in constant current without being adversely affected by voltage variations of an external source of power.

The connector 13 is electrically connected to the constant current controller 12 via two conductors 132 and comprises four terminals 131 for electrically connecting to one or two external sources of power.

The shell 2 comprises a cylindrical case 21, a cover 22, the cylinder 23, and a fastener 24. Each component is discussed in detailed below.

The case 21 comprises an externally threaded extension 211 (e.g., preferably male threads) projected from one end, a shoulder 213 at a joining portion of one end and the extension 211, and internal threads 212 (e.g., preferably female threads) at the other end.

The disk shaped cover 22 comprises a central through hole 221 having an inwardly extending rim 225, and a disk shaped lens or a transparent disk 222 dimensioned to fit in the hole 221, supported by the rim 225, and secured thereto by a liquid impermeable adhesive. Preferably, the lens or disk 222 is formed of reinforced plastic, glass, or acrylic plastic. The cover 22 further comprises an annular flange 223 having internal threads 224 on its inner surface. A first sealing ring 220 is put on the shoulder 213. A second sealing ring 226 is disposed under the rim 225 and against the top end 214. The provision of the first and second sealing rings 220 and 226 can ensure a waterproof engagement of the cover 22 and the case 21 when the threads 224 are secured to the externally threaded extension 211.

The cylinder 23 comprises a body 231, a bore 232, a positioning member 233 of curved section extended downward from the body 231 and fitted within the case 21, the threaded holes 235, and a pin 234 driven through the positioning member 233 to fasten the connector 13.

The fastener 24 comprises a hollow first portion 241 including an externally threaded first element 244 at one end, an externally threaded second element 245 at the other end, the threads of the first element 244 being more dense than that of the second element 245, a hexagonal flange (not numbered) disposed between the first element 244 and the second element 245, an annular trough 248 on a joining portion of the first element 244 and the flange, an O-ring 249 fitted in the through 248, and a knurled extension 246 projected downward from the second element 245.

The fastener 24 further comprises a cylindrical water-resistant member 243 tightly fitted in the knurled extension 246. The water-resistant member 243 comprises two through holes 247 such that wires 251 are adapted to pass through the water-resistant member 243 and the case 21 to be electrically connected to the connector 13.

The fastener 24 further comprises a hollow, cylindrical second portion 242 having inner threads secured to the second element 245.

With the above water-resistant arrangement, the light-emitting device is substantially waterproof.

Figure 3:
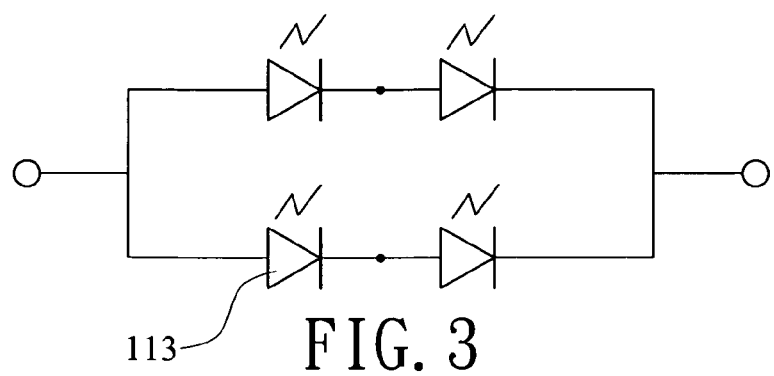
FIG. 3 is a circuit diagram of the LEDs.
Figure 4:
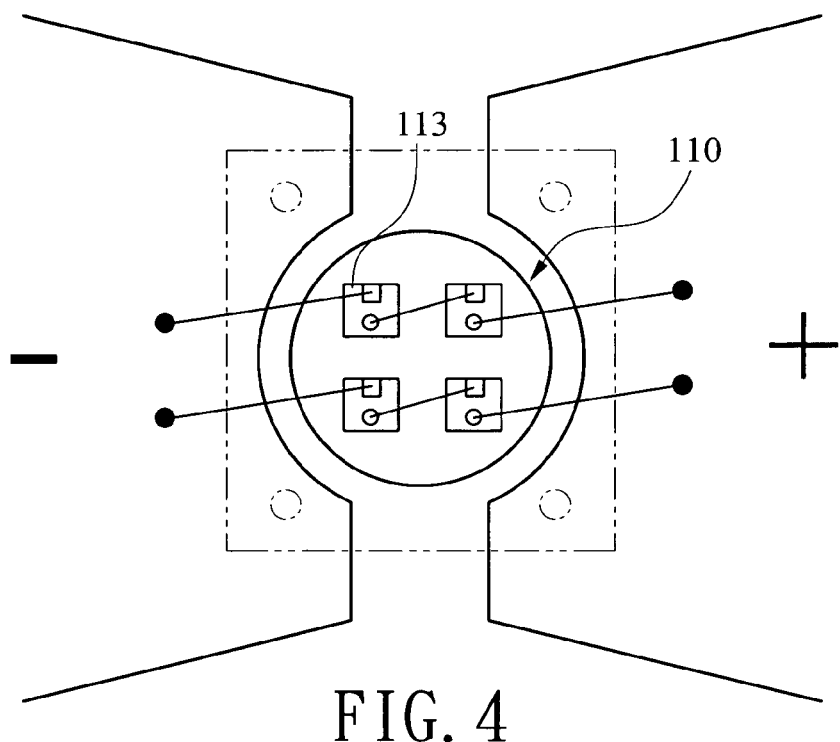
FIG. 4 schematically depicts wiring of the LED array.
Figure 5:
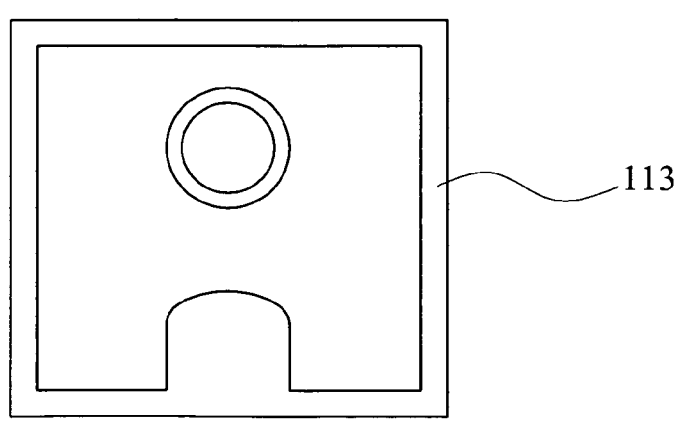
FIG. 5 is a plan view of the LED.

Referring to FIGS. 3 to 5, two LEDs 113 are electrically connected together in series and the other two LEDs 113 are also electrically connected together in series by wiring. Further, one pair of the connected LEDs 113 are connected in parallel to the other pair of the connected LEDs 113. Eventually, a thin high power LED array 110 is formed by encapsulation (see FIG. 4).

Figure 6:
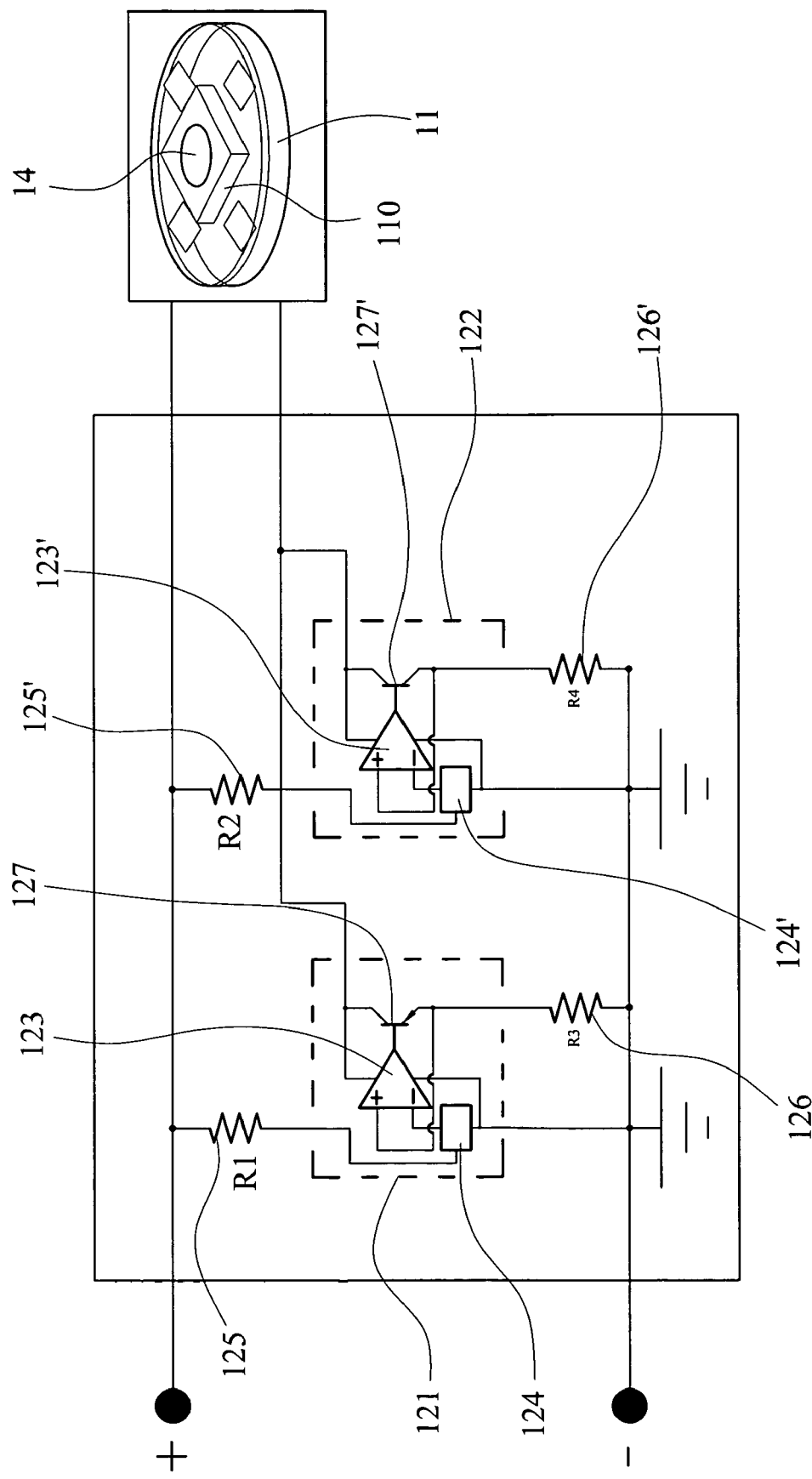
FIG. 6 is a circuit diagram of the constant current controller.

Referring to FIG. 6, the constant current controller 12 comprises first and second constant current control circuits 121 and 122 connected in parallel to the substrate 111 to supply the power to LED array 110. The first constant current control circuit 121 comprises an operational amplifier 123, a reference voltage source 124 electrically connected to a first resistor (R1) 125 which is in turn electrically connected to a positive terminal of a source of power such that a reference voltage can be applied to a negative terminal of the operational amplifier 123 via the first resistor 125 and the reference voltage source 124, a sampling resistor (R3) 126 interconnected a negative terminal of the source of power and a positive terminal of the operational amplifier 123 such that a sampling voltage can be applied to the positive terminal of the operational amplifier 123 via the sampling resistor 126, and a switch (e.g., preferably a transistor) 127 adapted to conduct or cut off an output of the first constant current control circuit 121 based on a comparison result of the reference voltage and the sampling voltage.

Likewise, the second constant current control circuit 122 comprises an operational amplifier 123', a reference voltage source 124' electrically connected to a first resistor (R2) 125' which is in turn electrically connected to a positive terminal of a source of power such that a reference voltage can be applied to a negative terminal of the operational amplifier 123' via the first resistor 125' and the reference voltage source 124', a sampling resistor (R4) 126' interconnected a negative positive terminal of the source of power and a positive terminal of the operational amplifier 123' such that a sampling voltage can be applied to the positive terminal of the operational amplifier 123' via the sampling resistor 126', and a switch (e.g., preferably a transistor) 127' adapted to conduct or cut off an output of the second constant current control circuit 122 based on a comparison result of the reference voltage and the sampling voltage. By configuring as above, the light 1 can always operate in constant current.

Referring to FIGS. 7, 8, and 9, connections of first, second, and third preferred embodiments of coin shaped spotlight are shown. The spotlight comprises a plurality of light-emitting devices including the light 1 and the shell 2. As shown in FIG. 7, in the first preferred embodiment the light-emitting devices are connected in series with a source of power 25 via a cord 251. As shown in FIG. 8, in the second preferred embodiment the light-emitting devices are connected in parallel with the source of power 25 via the cord 251. As shown in FIG. 9, in the third preferred embodiment each of the light-emitting devices is electrically connected to the source of power 25 via a dedicated one of four cords 251.

To summarize, the invention provides a coin shaped light 1 including a light-emitting member 11 including a plurality of LEDs 113 electrically connected together to form a LED array 110 by encapsulation and wiring. Eventually the LED array 110 is formed on a top of the substrate 111 and then the lens 14 is mounted thereon by encapsulation. The constant current controller 12 is adapted to supply a constant input current. As a result, a coin shaped light 1 having characteristics of constant current, high power output, wide operating voltage, energy saving, and prolonged useful time is formed.

To summarize, the invention further provides a light-emitting device including the light 1 and the shell 2. The light-emitting device has a diameter of about 25 mm and a length of about 80 mm.

To summarize, the invention yet further provides a coin shaped spotlight including a plurality of light-emitting devices which are connected in series, parallel, or otherwise connected together depending on applications.

While the invention herein disclosed has been described by means of specific embodiments, numerous modifications and variations could be made thereto by those skilled in the art without departing from the scope and spirit of the invention set forth in the claims.

What is claimed is:

1. A coin shaped light (1) comprising:
a light-emitting member (11) comprising a plurality of LEDs (113) and a lens (14) formed together by encapsulation;
a constant current controller (12) electrically connected to the light-emitting member (11) for supplying a constant current;
an electrical connector (13) electrically connected the constant current controller (12) and the light-emitting member (11) to a source of power; and
a hollow cylinder (23) for fastening the light-emitting member (11), the constant controller (12), and the connector (13) together as a coin shaped light unit.

2. The light (1) of claim 1, wherein the light-emitting member (11) further comprises a substrate (111) and a LED array (110) together with the lens (14) formed on a surface of the substrate (111) by encapsulation.

3. The light (1) of claim 2, wherein the LED array (110) are formed by electrically connecting the plurality of LEDs (113) together by encapsulation and wiring.

4. The light (1) of claim 1, wherein the constant current controller (12) comprises parallel first and second constant current control circuits (121; 122), each of the first and second constant current control circuits (121; 122) comprising:
an operational amplifier (123 or 123'); a reference voltage source (124 or 124') electrically connected to a first resistor (125 or 125') which is in turn electrically connected to a positive terminal of the source of power so as to apply a reference voltage to a negative terminal of the operational amplifier (123 or 123') via the first resistor (125 or 125') and the reference voltage source (124 or 124'); a sampling resistor (126 or 126') interconnected a negative terminal of the source of power and a positive terminal of the operational amplifier (123 or 123') so as to apply a sampling voltage to the positive terminal of the operational amplifier (123 or 123') via the sampling resistor (126 or 126'); and a switch (127 or 127') adapted to conduct or cut off an output of either the first constant current control circuit (121) or the second constant current control circuit (122) based on a comparison result of the reference voltage and the sampling voltage.

5. The light (1) of claim 1, wherein the connector (13) comprises two conductors (132) electrically connected the constant current controller (12) and a plurality of pairs of terminals (131), each pair of terminals (131) adapted to electrically connect to the source of power.

6. A coin shaped spotlight including a plurality of light-emitting devices each comprising:
a light (1) comprising;
a light-emitting member (11) comprising a plurality of LEDs (113) and a lens (14) formed together by encapsulation;
a constant current controller (12) electrically connected to the light-emitting member (11) for suplying a constant current; and
an electrical connector (13) electrically connected the constant current controller (12) and the light-emitting member (11) to a source of power; and
a shell (2) comprising:
a hollow cylindrical case (21); a cover (22) releasable secured to one end of the case (21) and comprising a central through hole (221);
a hollow cylinder (23) mounted within the case (21) for fastening the light-emitting member (11), the constant current controller (12), and the connector (13) together; and
a fastener (24) threadedly secured to the other end of the case (21) and comprising a hollow internal water-resistant member (243) with wires (251) passed through the water-resistant member (243) and the case (21).

7. The spotlight of claim 6, wherein the light-emitting member (11) further comprises a substrate (111) and a LED array (110) together with the lens (14) formed on a surface of the substrate (111) by encapsulation, and wherein the substrate (111) comprises a plurality of fasteners (15) driven into the cylinder (23) for securing the substrate (111) to the cylinder (23).

8. The spotlight of claim 6, wherein the constant current controller (12) comprises parallel first and second constant current control circuits (121; 122), each of the first and second constant current control circuits (121; 122) comprising: an operational amplifier (123 or 123'); a reference voltage source (124 or 124') electrically connected to a first resistor (125 or 125') which is in turn electrically connected to a positive terminal of the source of power so as to apply a reference voltage to a negative terminal of the operational amplifier (123 or 123') via the first resistor (125 or 125') and the reference voltage source (124 or 124'); a sampling resistor (126 or 126') interconnected a negative terminal of the source of power and a positive terminal of the operational amplifier (123 or 123') so as to apply a sampling voltage to the positive terminal of the operational amplifier (123 or 123') via the sampling resistor (126 or 126'); and a switch (127 or 127') adapted to conduct or cut off an output of either the first constant current control circuit (121) or the second constant current control circuit (122) based on a comparison result of the reference voltage and the sampling voltage.

9. The spotlight of claim 6, wherein the connector (13) comprises two conductors (132) electrically connected the constant current controller (12) and a plurality of pairs of terminals (131), each pair of terminals (131) adapted to electrically connect to the source of power.

10. The spotlight of claim 6, wherein the cover (22) further comprises a lens (222) configured and dimensioned to mount in the through hole (221).

11. The spotlight of claim 6, wherein the cylinder (23) comprises a body (231), a positioning member (233) of curved section extended downward from the body (231) and comprising a plurality of threaded holes (235) on one end for fastening the light-emitting member (11) thereon by the fasteners (15), and a pin (234) inserted through the positioning member (233) to fasten the positioning member (233) and the connector (13) together.

12. The spotlight of claim 6, wherein the wires (251) are electrically connected to the connector (13), and wherein the fastener (24) further comprises: a hollow first portion (241) comprising an externally threaded first element (244) at one end, an externally threaded second element (245) at the other end, and a knurled extension (246) projected from the second element (245); and a hollow second portion (242) having inner threads secured to the second element (245) for fastening the knurled extension (246) in the water-resistant member (243).

13. A coin shaped light (1) comprising:
a light-emitting member (11) comprising a plurality of LEDs (113) and a lens (14) formed together by encapsulation;
a constant current controller (12) electrically connected to the light-emitting member (11) for supplying a constant current; and
an electrical connector (13) electrically connected the constant current controller (12) and the light-emitting member (11) to a source of power;

wherein the constant current controller (12) comprises parallel first and second constant current control circuits (121; 122), each of the first and second constant current control circuits (121; 122) comprising: an operational amplifier (123 or 123'); a reference voltage source (124 or 124') electrically connected to a first resistor (125 or 125') which is in turn electrically connected to a positive terminal of the source of power so as to apply a reference voltage to a negative terminal of the operational amplifier (123 or 123') via the first resistor (125 or 125') and the reference voltage source (124 or 124'); a sampling resistor (126 or 126') interconnected a negative terminal of the source of power and a positive terminal of the operational amplifier (123 or 123') so as to apply a sampling voltage to the positive terminal of the operational amplifier (123 or 123') via the sampling resistor (126 or 126'); and a switch (127 or 127') adapted to conduct or cut off an output of either the first constant current control circuit (121) or the second constant current control circuit (122) based on a comparison result of the reference voltage and the sampling voltage.

* * * * *